United States Patent
Hsieh et al.

(10) Patent No.: US 12,422,456 B2
(45) Date of Patent: Sep. 23, 2025

(54) PROBE CARD

(71) Applicant: Unimicron Technology Corp., Taoyuan (TW)

(72) Inventors: Chih-Peng Hsieh, Taoyuan (TW); Chihmin Yang, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 142 days.

(21) Appl. No.: 18/406,231

(22) Filed: Jan. 8, 2024

(65) Prior Publication Data
US 2025/0172587 A1    May 29, 2025

(30) Foreign Application Priority Data
Nov. 24, 2023   (TW) .................. 112145556

(51) Int. Cl.
| | | |
|---|---|---|
| *G01R 1/073* | (2006.01) | |
| *G01R 1/02* | (2006.01) | |
| *G01R 1/04* | (2006.01) | |
| *G01R 1/067* | (2006.01) | |
| *G01R 31/28* | (2006.01) | |

(52) U.S. Cl.
CPC .............................. *G01R 1/07342* (2013.01)

(58) Field of Classification Search
CPC . G01R 1/02; G01R 1/04; G01R 1/067; G01R 1/073; G01R 31/02; G01R 31/28; G01R 31/2889
See application file for complete search history.

(56) References Cited

U.S. PATENT DOCUMENTS

| | | | | |
|---|---|---|---|---|
| 10,928,422 | B2 * | 2/2021 | Kim | G01R 1/07371 |
| 11,828,774 | B2 * | 11/2023 | Crippa | G01R 1/06761 |
| 2008/0054918 | A1 * | 3/2008 | Lin | G01R 1/06772 |
| | | | | 324/756.03 |
| 2020/0300893 | A1 * | 9/2020 | Lee | G01R 1/07342 |

FOREIGN PATENT DOCUMENTS

| | | |
|---|---|---|
| CN | 1662820 | 8/2005 |
| CN | 107533085 | 1/2018 |

* cited by examiner

*Primary Examiner* — Neel D Shah
(74) *Attorney, Agent, or Firm* — JCIPRNET

(57) ABSTRACT

A probe card includes an adapter plate, a guide plate and a plurality of probes. The guide plate incudes a first guide plate portion, a second guide plate portion and a capacitor structure. The probes include at least one first ground probe, at least one second ground probe and a plurality of power probes. The first ground probe penetrates through the first guide plate portion and is connected to the capacitor structure and the adapter plate. The second ground probe and the power probes penetrate through the first guide plate portion, the capacitor structure and the second guide plate portion and are connected to the adapter plate. The first ground probe is used to provide voltage to the capacitive structure to generate a potential difference. The power probes draw current through the capacitor structure and form a current loop with the second ground probe.

10 Claims, 3 Drawing Sheets

PROBE CARD

CROSS-REFERENCE TO RELATED APPLICATION

This application claims the priority benefit of Taiwan application serial no. 112145556, filed on Nov. 24, 2023. The entirety of the above-mentioned patent application is hereby incorporated by reference herein and made a part of this specification.

BACKGROUND

Technical Field

The disclosure relates to a test device, and more particularly, to a probe card.

Description of Related Art

Generally speaking, the test machine provides voltage/current to the device under test (DUT) end when the prober card is tested. When the current drawn by the integrated circuit (IC) is too fast or too large, the power supply will easily produce an instantaneous voltage drop (AC Voltage Drop). At this time, the machine will provide a compensation current. Due to the large parasitic inductance between the machine and the device under test, the compensation current cannot reach the device under test in time, so the de-coupling capacitor is usually placed close to the device under test, such as on an adapter plate or the printed circuit board. However, this will make the design of the probe stuck on the wiring difficult, and the inductance of the probe path can only be improved by selecting shorter pins. Therefore, how to reduce the parasitic effect of the probe between the device under test and the de-coupling capacitor path is the main issue at this stage to improve power integrity (PI).

SUMMARY

The disclosure provides a probe card that improves test signals integrity.

The probe card of the disclosure includes an adapter plate, a guide plate and a plurality of probes. The guide plate is disposed on one side of the adapter plate and includes a first guide plate portion, a second guide plate portion and a capacitor structure. The second guide plate portion and the first guide plate portion are disposed in a hollow ring shape at intervals, and the capacitor structure is disposed in the second guide plate portion and connected to the second guide plate portion. The probes are electrically connected to the adapter plate and include at least one first ground prober, at least one second ground prober and a plurality of power probers. The first ground prober penetrates through the first guide plate portion and is connected to the capacitor structure and the adapter plate. The second ground prober and the power probers penetrate through the first guide plate portion, the capacitor structure and the second guide plate portion and are connected to the adapter plate. The first ground prober is used to provide voltage to the capacitor structure to generate a potential difference, and the power probes draw current through the capacitor structure and form a current loop with the second ground prober.

In an embodiment of the disclosure, the adapter plate includes a plurality of power pads and a plurality of ground pads. The first ground prober and the second ground prober are electrically connected to the ground pads, respectively, and the power probers are electrically connected to the power pads, respectively.

In an embodiment of the disclosure, the probe card further includes an insulating layer disposed on a portion of each of the probes.

In an embodiment of the disclosure, the capacitor structure has a plurality of openings and includes a first metal layer, a second metal layer and a dielectric layer. The dielectric layer is located between the first metal layer and the second metal layer. The openings are separated from each other and penetrate the first metal layer, the dielectric layer and the second metal layer.

In an embodiment of the disclosure, the first ground prober directly contacts the first metal layer. The power probers and the second ground prober are obliquely located in the openings, respectively, and each of the power probers indirectly contacts the first metal layer through the insulating layer and at least directly contacts the second metal layer. The second ground prober at least directly contacts the first metal layer and indirectly contacts the second metal layer through the insulating layer.

In an embodiment of the disclosure, the capacitor structure has at least one first opening and a plurality of second openings, and includes a first ceramic material layer, a second ceramic material layer, a dielectric layer, a first patterned conductive layer and a second patterned conductive layer. The dielectric layer is located at the between the first ceramic material layer and the second ceramic material layer. The first opening and the second openings are separated from each other and penetrate the first ceramic material layer, the dielectric layer and the second ceramic material layer. The first patterned conductive layer partially covers the first ceramic material layer and a portion of the first opening. The second patterned conductive layer partially covers the second ceramic material layer and a portion of each of second openings.

In an embodiment of the disclosure, the first ground prober directly contacts the first patterned conductive layer. The second ground prober is obliquely located in the first opening and at least directly contacts the first patterned conductive layer. The power probers are obliquely located in the second openings, respectively, and at least directly contact the second patterned conductive layer.

In an embodiment of the disclosure, the capacitor structure has at least one first opening and a plurality of second openings, and includes a metal layer, a ceramic material layer, a dielectric layer, a patterned conductive layer and an insulating layer. The dielectric layer is located between the metal layer and the ceramic material layer. The first opening and the second openings are separated from each other and penetrate the metal layer, the dielectric layer and the ceramic material layer. The patterned conductive layer partially covers the ceramic material layer and a portion of each of the second openings. The insulating layer partially covers the metal layer and another portion of each of the second openings.

In an embodiment of the disclosure, the first ground prober directly contacts the metal layer. The second ground prober is obliquely located in the first opening and at least directly contacts the metal layer. The power probers are obliquely located in the second openings, respectively, and indirectly contact the metal layer through the insulating layer and at least directly contact the patterned conductive layer.

In an embodiment of the disclosure, the capacitor structure is a parallel plate capacitor structure.

Based on the above, in the probe card of the disclosure, the first ground prober is connected to the capacitor structure to provide voltage to the capacitor structure to generate a potential difference, and the power probers draw current through the capacitor structure and form a current loop with the second ground prober. That is to say, the disclosure solves the problem of instantaneous voltage drop in the prior art by providing real-time power supply through the capacitor structure of the guide plate, thereby improving the integrity of the test signal.

In order to make the aforementioned features and advantages of the disclosure comprehensible, embodiments accompanied with drawings are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
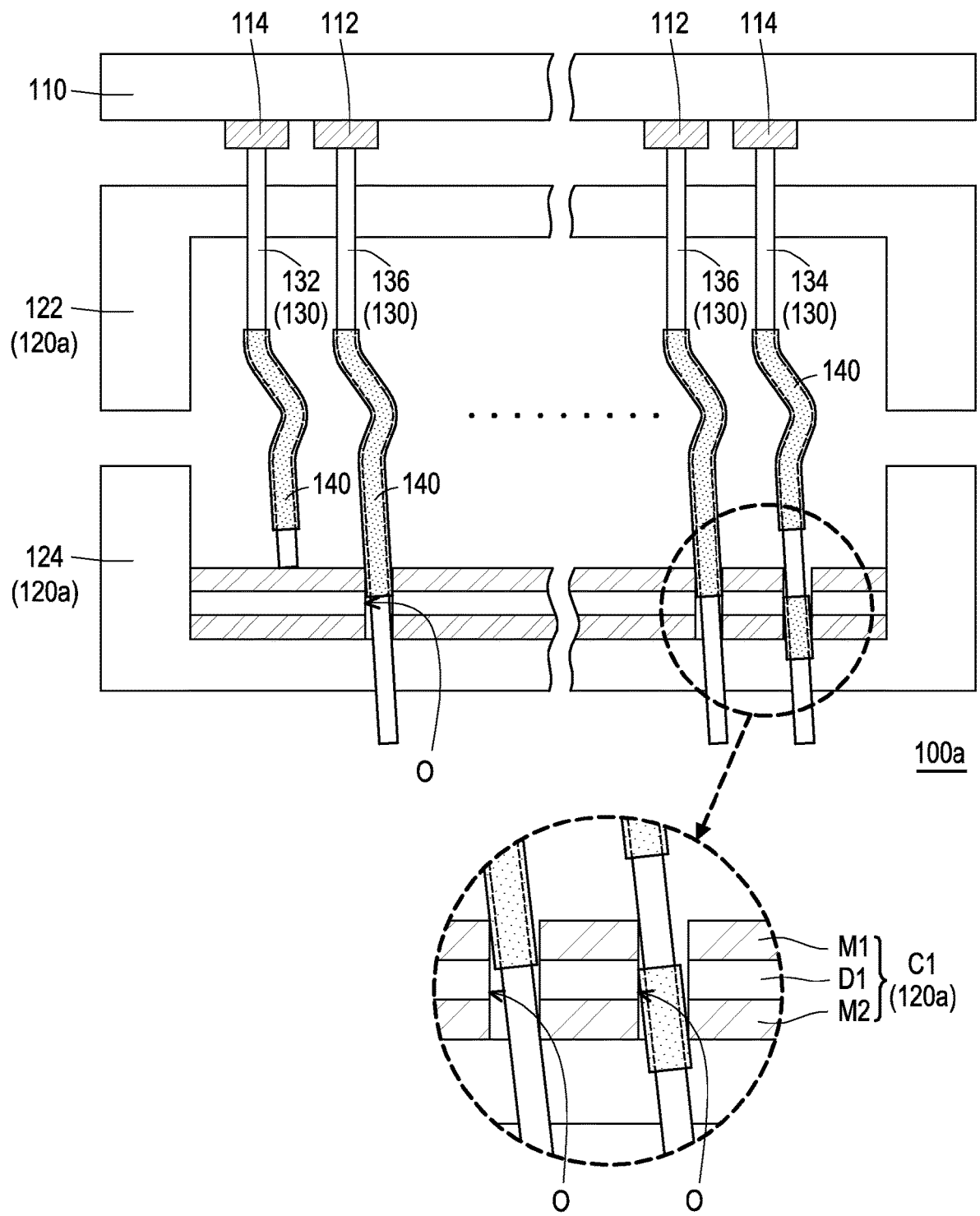
FIG. 1 is a schematic diagram of a probe card according to an embodiment of the disclosure.

The disclosure can be understood by referring to the following detailed description in conjunction with the accompanying drawings. It should be noted that, for the sake of ease of understanding for the reader and for the simplicity of the drawings, the elements in the drawings are not drawn to actual scale. In addition, the number and size of components in the figures are only for illustration and are not intended to limit the scope of the disclosure.

FIG. 1 is a schematic diagram of a probe card according to an embodiment of the disclosure. Please refer to FIG. 1. In this embodiment, the prober card 100a includes an adapter plate 110, a guide plate 120a and a plurality of probers 130. The guide plate 120a is disposed on one side of the adapter plate 110 and includes a first guide plate portion 122, a second guide plate portion 124 and a capacitor structure C1. The second guide plate portion 124 and the first guide plate portion 122 are disposed in a hollow ring shape at intervals, and the capacitor structure C1 is disposed in the second guide plate portion 124 and connected to the second guide plate portion 124. The probers 130 are electrically connected to the adapter plate 110 and include at least one first ground prober (schematically shown one first ground prober 132), at least one second ground prober (schematically shown one second ground prober 134) and a plurality of power probers. (schematically shown two power probers 136). The first ground prober 132 penetrates through the first guide plate portion 122 and is connected to the capacitor structure C1 and the adapter plate 110. The second ground prober 134 and the power probers 136 penetrate through the first guide plate portion 122, the capacitor structure C1 and the second guide plate portion 124 and are connected to the adapter plate 110. The first ground prober 132 is used to provide voltage to the capacitor structure C1 to generate a potential difference. The power probers 136 draw current through the capacitor structure C1 and form a current loop with the second ground prober 134.

In detail, the adapter plate 110 of this embodiment includes a plurality of power pads 112 and a plurality of ground pads 114 that are separated from each other. The first ground probers 132 and the second ground probers 134 are electrically connected to the ground pads 114, respectively. The power probes 136 are electrically connected to the power pads 112, respectively. In one embodiment, the adapter plate 110 is, for example, a multi-layer organic (MLO) plate, or a multi-layer ceramic (MLC) plate, or can be regarded as a Space Transformer (ST).

Furthermore, the guide plate 120a of this embodiment is located between the adapter plate 110 and the device under test (not shown), in which the shape of the first guide plate portion 122 and the shape of the second guide plate portion 124 are both U-shaped and have a mirror pattern. In one embodiment, the guide plate 120a is, for example, a ceramic guide plate, but is not limited thereto. The capacitor structure C1 of the guide plate 120a is embodied as a parallel plate capacitor structure, which has a plurality of openings (schematically shown three openings O) and includes a first metal layer M1, a second metal layer M2 and a dielectric layer D1. The dielectric layer D1 is located between the first metal layer M1 and the second metal layer M2, and the openings O are separated from each other and penetrates the first metal layer M1, the dielectric layer D1 and the second metal layer M2. In one embodiment, the dielectric layer D1 is made of a high dielectric constant (high Dk) material, but is not limited thereto.

In addition, the probe card 100a of this embodiment further includes an insulating layer 140, which is disposed on at least a part of each probe 130. As shown in FIG. 1, the first ground prober 132 directly contacts the first metal layer M1, since the first ground prober 132 can be used to provide the voltage of the capacitor structure C1 to generate a potential difference, the first ground prober 132 can be regarded as a charging probe. In one embodiment, the first ground prober 132 can be disposed in an inactive area or an area far away from the working area to provide sufficient power to the capacitor structure C1 to charge the capacitor structure C1. The power probers 136 and the second ground prober 134 are obliquely located in the openings O, respectively. Each power prober 136 indirectly contacts the first metal layer M1 through the insulating layer 140, and at least directly contacts the second metal layer M2. The second ground prober 134 at least directly contacts the first metal layer M1, and indirectly contacts the second metal layer M2 through the insulating layer 140. It should be noted that the power probers 136 and the second ground prober 134 are in a non-inclined state in the initial state. However, in order to make the action direction consistent during the operation process, the first guide plate portion 122 and the second guide plate portion 124 are misaligned. This causes the power probers 136 and the second ground prober 134 to incline, thereby also determining the connection point between the prober and the metal layer. Herein, the first ground prober 132, the second ground prober 134 and the power probers 136 have different types due to different placement positions of the insulating layer 140. That is, there are three types of mixed needle modes, but they are not limited to this.

Since the first ground prober 132 of this embodiment is connected to the capacitor structure C1, it is used to provide the voltage of the capacitor structure C1 to generate a potential difference, and the power probers 136 draw current through the capacitor structure C1 and form a current loop with the second ground prober 134. That is to say, this embodiment uses the capacitor structure C1 of the guide plate 120a to provide real-time power supply to solve the problem of instantaneous voltage drop in the prior art. Also because the location of the capacitor structure C1 greatly shortens the distance between the power supply and the device under test, the parasitic inductance can be reduced, so that the test high voltage (VIH) can be effectively identified, which can avoid interpretation errors caused by blurred test signals, thereby improving the integrity of the test signal.

It must be noted here that the following embodiments use the component numbers and part of the content of the previous embodiments, where the same numbers are used to represent the same or similar elements, and descriptions of the same technical content are omitted. For descriptions of omitted parts, reference may be made to the foregoing embodiments and will not be repeated in the following embodiments.

Figure 2:
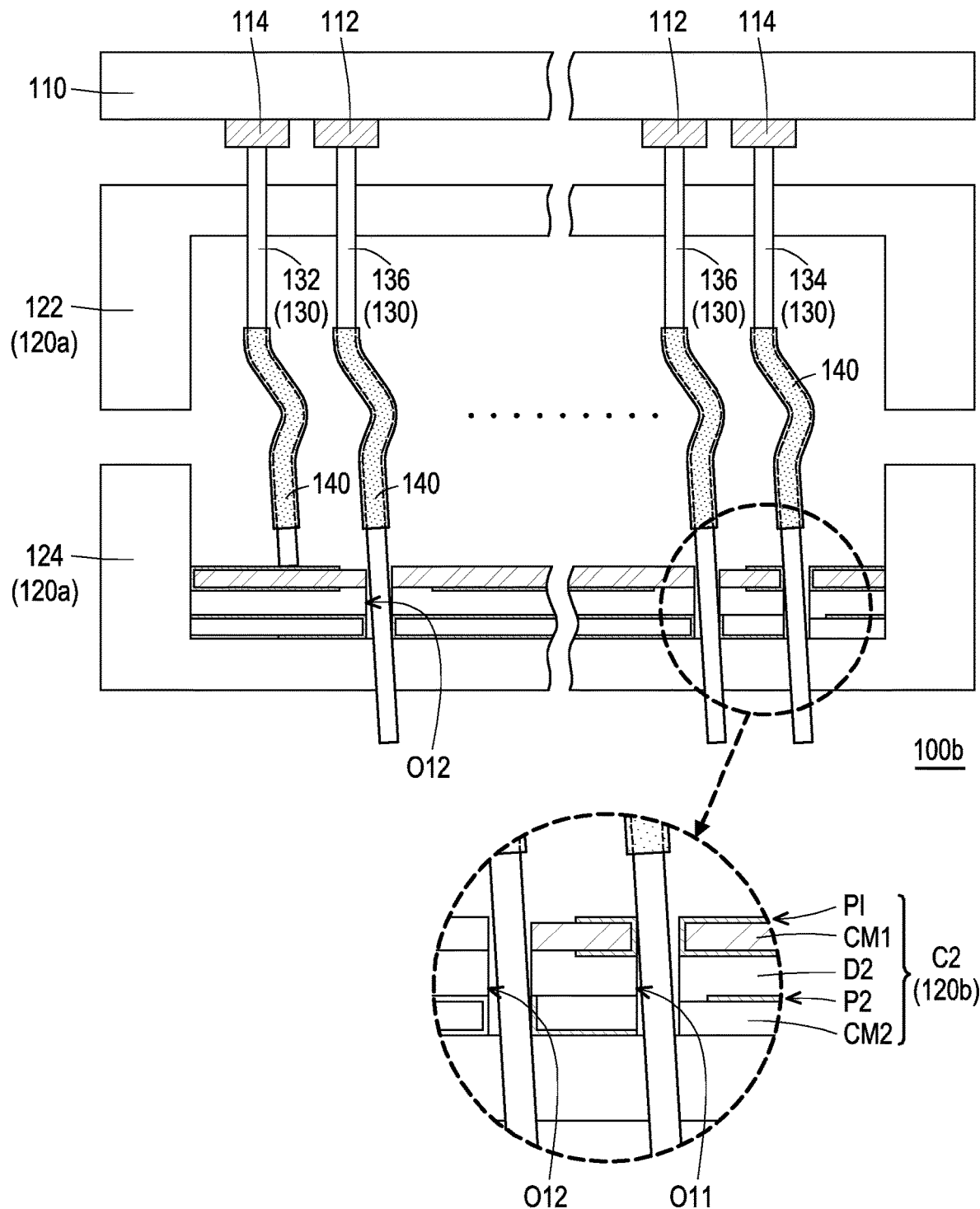
FIG. 2 is a schematic diagram of a probe card according to another embodiment of the disclosure.

FIG. 2 is a schematic diagram of a probe card according to another embodiment of the disclosure. With reference to both FIG. 1 and FIG. 2, the probe card 100b of this embodiment is similar to the probe card 100a of FIG. 1, and the main difference between the two is that in this embodiment, the capacitor structure C2 of the guide plate 120b is different from the capacitor structure C1 of the guide plate 120a of FIG. 1.

Specifically, in this embodiment, the capacitor structure C2 of the guide plate 120b has at least one first opening (schematically showing one first opening O11) and a plurality of second openings (schematically showing two second openings O12), and includes a first ceramic material layer CM1, a second ceramic material layer CM2, a dielectric layer D2, a first patterned conductive layer P1 and a second patterned conductive layer P2. The dielectric layer D2 is located between the first ceramic material layer CM1 and the second ceramic material layer CM2. The first opening O11 and the second openings O12 are separated from each other and penetrate the first ceramic material layer CM1, the dielectric layer D2 and the second ceramic material layer CM2. The first patterned conductive layer P1 partially covers the first ceramic material layer CM1 and part of the first opening O11. The second patterned conductive layer P2 partially covers the second ceramic material layer CM2 and a part of each second opening O12.

As shown in FIG. 2, the first ground prober 132, the second ground prober 134 and the power probers 136 have the same structural type because the insulating layer 140 is disposed at the same position, which can improve the convenience of assembly. Specifically, the first ground prober 132 directly contacts the first patterned conductive layer P1 to provide voltage to the capacitor structure C2 to generate a potential difference. The second ground prober 134 is obliquely located in the first opening O11 and at least directly contacts the first patterned conductive layer P1. The power probers 136 are obliquely located in the second opening O12, respectively, and at least directly contact the second patterned conductive layer P2. Because the design of the guide plate 120b is different from the design of the aforementioned guide plate 120a, probes of the same structural type can be distinguished according to the position of contact with the guide plate 120b. The power probers 136 draw current through the capacitor structure C2 and form a current loop with the second ground prober 134. That is to say, this embodiment uses the capacitor structure C2 of the guide plate 120b to provide real-time power supply to solve the problem of instantaneous voltage drop in the prior art. Also because the location of the capacitor structure C2 greatly shortens the distance between the power supply and the device under test, the parasitic inductance can be reduced, so that the test high voltage (VIH) can be effectively identified, which can avoid interpretation errors caused by blurred test signals, thereby improving the integrity of the test signal.

Figure 3:
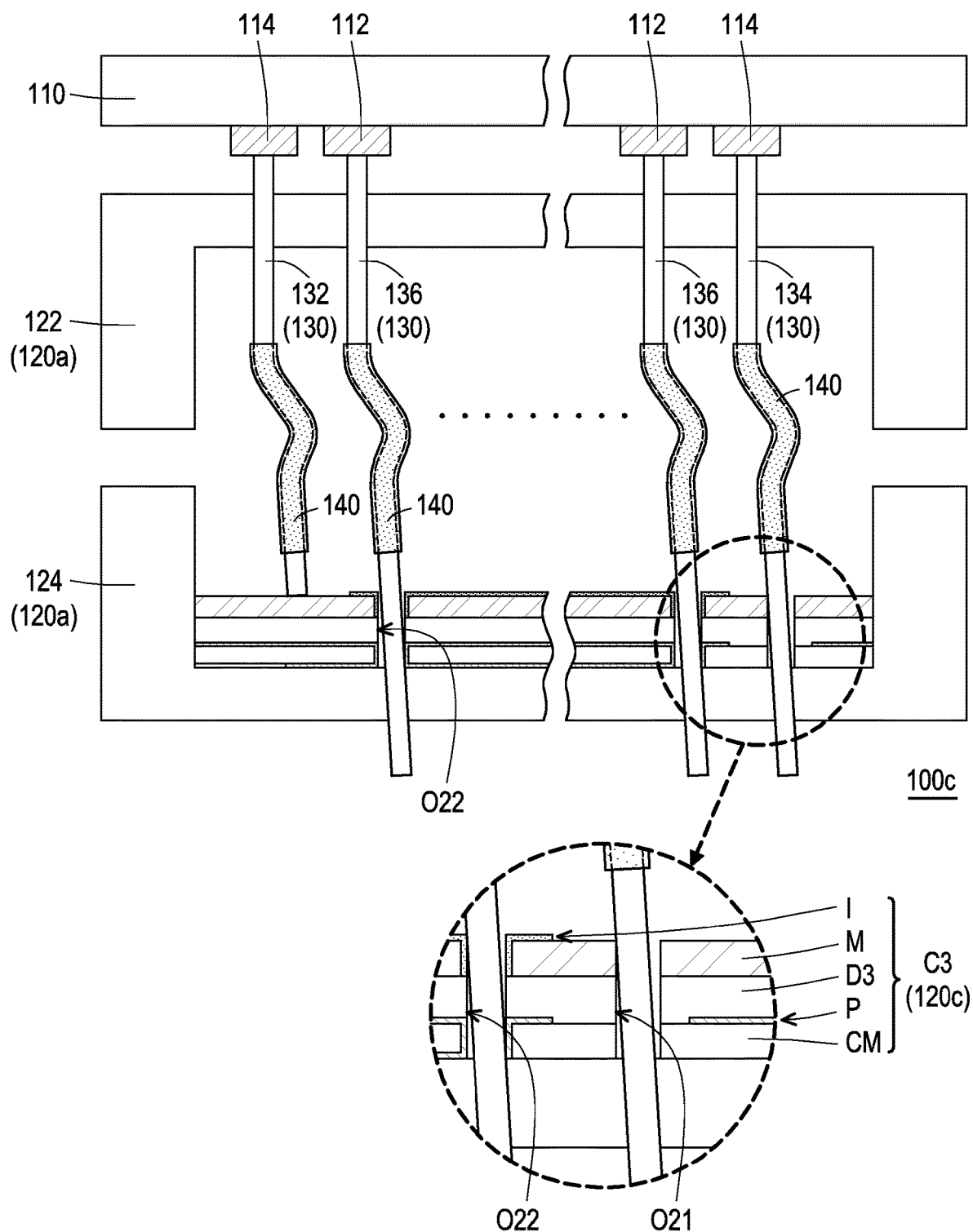
FIG. 3 is a schematic diagram of a probe card according to another embodiment of the disclosure.

FIG. 3 is a schematic diagram of a probe card according to another embodiment of the disclosure. With reference to both FIG. 1 and FIG. 3, the probe card 100c of this embodiment is similar to the probe card 100a of FIG. 1, and the main difference between the two is that in this embodiment, the capacitor structure C3 of the guide plate 120c is different from the capacitor structure C1 of the guide plate 120a of FIG. 1.

Specifically, in this embodiment, capacitor structure C3 has at least one first opening (schematically showing one first opening O21) and a plurality of second openings (schematically showing two second openings O22), and includes a metal layer M, a ceramic material layer CM, a dielectric layer D3, a patterned conductive layer P and an insulating layer I. The dielectric layer D3 is located between the metal layer M and the ceramic material layer CM. The first opening O21 and the second openings O22 are separated from each other and penetrate the metal layer M, the dielectric layer D3 and the ceramic material layer CM. The patterned conductive layer P partially covers the ceramic material layer CM and a part of each second opening O22. The insulating layer I partially covers the metal layer M and another part of each second opening O22.

As shown in FIG. 3, the first ground prober 132, the second ground prober 134 and the power probers 136 have the same structural type because the insulating layer 140 is disposed at the same position, which can improve the convenience of assembly. Specifically, the first ground prober 132 directly contacts the metal layer M to provide voltage to the capacitor structure C3 to generate a potential difference. The second ground prober 134 is obliquely located in the first opening O21 and at least directly contacts the metal layer M. The power probes 136 are obliquely located in the second openings O22, respectively, and indirectly contact the metal layer M through the insulating layer I and at least directly contact the patterned conductive layer P. Because the design of the guide plate 120c is different from the design of the aforementioned guide plate 120a, probes of the same structural type can be distinguished according to the position of contact with the guide plate 120c. The power probers 136 draw current through the capacitor structure C3 and form a current loop with the second ground prober 134. That is to say, this embodiment uses the capacitor structure C3 of the guide plate 120c to provide real-time power supply to solve the problem of instantaneous voltage drop in the prior art. Also because the location of the capacitor structure C3 greatly shortens the distance between the power supply and the device under test, the parasitic inductance can be reduced, so that the test high voltage (VIH) can be effectively identified, which can avoid interpretation errors caused by blurred test signals, thereby improving the integrity of the test signal.

To sum up, in the probe card of the disclosure, the first ground prober is connected to the capacitor structure to provide voltage to the capacitor structure to generate a potential difference, and the power probers draw current through the capacitor structure and form a current loop with the second ground prober. That is to say, the disclosure solves the problem of instantaneous voltage drop in the prior art by providing real-time power supply through the capacitor structure of the guide plate, thereby improving the integrity of the test signal.

Although the disclosure has been disclosed above through embodiments, they are not intended to limit the disclosure. Anyone with ordinary knowledge in the relevant technical field can make some changes and modifications without departing from the spirit and scope of the disclosure. Therefore, the protection scope of the disclosure shall be determined by the appended patent application scope.

What is claimed is:

1. A probe card, comprising:
an adapter plate;
a guide plate disposed on one side of the adapter plate and comprising a first guide plate portion, a second guide plate portion and a capacitor structure, wherein the second guide plate portion and the first guide plate portion are disposed in a hollow ring shape at intervals, and the capacitor structure is disposed in the second guide plate portion and connected to the second guide plate portion; and
a plurality of probes electrically connected to the adapter plate and comprising at least one first ground prober, at least one second ground prober and a plurality of power probers, the at least one first ground prober penetrating through the first guide plate portion and connected to the capacitor structure and the adapter plate, and the at least one second ground prober and the plurality of power probers penetrating through the first guide plate portion, the capacitor structure and the second guide plate portion and connected to the adapter plate, wherein the at least one first ground prober is used to provide voltage to the capacitor structure to generate a potential difference, and the plurality of power probes draw current through the capacitor structure and form a current loop with the at least one second ground prober.

2. The probe card according to claim 1, wherein the adapter plate comprises a plurality of power pads and a plurality of ground pads, the at least one first ground prober and the at least one second ground prober are electrically connected to the plurality of ground pads, respectively, and the plurality of power probers are electrically connected to the plurality of power pads, respectively.

3. The probe card according to claim 1, further comprising:
an insulating layer disposed on a portion of each of the plurality of probes.

4. The probe card according to claim 3, wherein the capacitor structure has a plurality of openings and comprises a first metal layer, a second metal layer and a dielectric layer, the dielectric layer is located between the first metal layer and the second metal layer, the plurality of openings are separated from each other and penetrate the first metal layer, the dielectric layer and the second metal layer.

5. The probe card according to claim 4, wherein the at least one first ground prober directly contacts the first metal layer, and the plurality of power probers and the at least one second ground prober are obliquely located in the plurality of openings, respectively, and each of the plurality of power probers indirectly contacts the first metal layer through the insulating layer and at least directly contacts the second metal layer, and the at least one second ground prober at least directly contacts the first metal layer and indirectly contacts the second metal layer through the insulating layer.

6. The probe card according to claim 1, wherein the capacitor structure has at least one first opening and a plurality of second openings, and comprises a first ceramic material layer, a second ceramic material layer, a dielectric layer, a first patterned conductive layer and a second patterned conductive layer, and the dielectric layer is located at the between the first ceramic material layer and the second ceramic material layer, the at least one first opening and the plurality of second openings are separated from each other and penetrate the first ceramic material layer, the dielectric layer and the second ceramic material layer, and the first patterned conductive layer partially covers the first ceramic material layer and a portion of the at least one first opening, and the second patterned conductive layer partially covers the second ceramic material layer and a portion of each of the plurality of second openings.

7. The probe card according to claim 6, wherein the at least one first ground prober directly contacts the first patterned conductive layer, the at least one second ground prober is obliquely located in the at least one first opening and at least directly contacts the first patterned conductive layer, and the plurality of power probers are obliquely located in the plurality of second openings, respectively, and at least directly contact the second patterned conductive layer.

8. The probe card according to claim 1, wherein the capacitor structure has at least one first opening and a plurality of second openings, and comprises a metal layer, a ceramic material layer, a dielectric layer, a patterned conductive layer and an insulating layer, the dielectric layer is located between the metal layer and the ceramic material layer, the at least one first opening and the plurality of second openings are separated from each other and penetrate the metal layer, the dielectric layer and the ceramic material layer, the patterned conductive layer partially covers the ceramic material layer and a portion of each of the plurality of second openings, and the insulating layer partially covers the metal layer and an another portion of each of the plurality of second openings.

9. The probe card according to claim 8, wherein the at least one first ground prober directly contacts the metal layer, the at least one second ground prober is obliquely located in the at least one first opening and at least directly contacts the metal layer, and the plurality of power probers are obliquely located in the plurality of second openings, respectively, and indirectly contact the metal layer through the insulating layer and at least directly contact the patterned conductive layer.

10. The probe card according to claim 1, wherein the capacitor structure is a parallel plate capacitor structure.

* * * * *